US010269783B2

(12) United States Patent
Thazhathidathil et al.

(10) Patent No.: US 10,269,783 B2
(45) Date of Patent: Apr. 23, 2019

(54) IMPLANT STRUCTURE FOR AREA REDUCTION

(71) Applicant: ARM Limited, Cambridge (GB)

(72) Inventors: Abhilash V. Thazhathidathil, Bangalore (IN); Denil Das Kolady, Bangalore (IN); Anand Dhanalakshmi Ramdass, Bangalore (IN)

(73) Assignee: ARM Limited, Cambridge (GB)

( * ) Notice: Subject to any disclaimer, the term of this patent is extended or adjusted under 35 U.S.C. 154(b) by 71 days.

(21) Appl. No.: 15/004,852

(22) Filed: Jan. 22, 2016

(65) Prior Publication Data
US 2017/0213814 A1 Jul. 27, 2017

(51) Int. Cl.
| | |
|---|---|
| H01L 21/74 | (2006.01) |
| H01L 27/02 | (2006.01) |
| H01L 29/06 | (2006.01) |
| H01L 21/265 | (2006.01) |
| H01L 23/522 | (2006.01) |
| H01L 23/528 | (2006.01) |
| H01L 27/118 | (2006.01) |
| H01L 21/8234 | (2006.01) |
| H01L 21/8238 | (2006.01) |
| H01L 23/48 | (2006.01) |
| H01L 23/52 | (2006.01) |
| H01L 29/40 | (2006.01) |

(52) U.S. Cl.
CPC ........ *H01L 27/0207* (2013.01); *H01L 21/743* (2013.01); *H01L 21/823493* (2013.01); *H01L 21/823892* (2013.01); *H01L 23/528* (2013.01); *H01L 23/5226* (2013.01); *H01L 27/11807* (2013.01); *H01L 29/0688* (2013.01); *H01L 21/26513* (2013.01); *H01L 2027/11861* (2013.01)

(58) Field of Classification Search
CPC ........... H01L 27/0207; H01L 27/11807; H01L 27/092
USPC ................ 257/E27.062, E27.108, 369, 371, 257/E21.632; 438/199
See application file for complete search history.

(56) References Cited

U.S. PATENT DOCUMENTS

| | | | | |
|---|---|---|---|---|
| 5,473,183 A | * | 12/1995 | Yonemoto | ........... H01L 27/0928 257/371 |
| 2006/0202231 A1 | * | 9/2006 | Yamamoto | ........ H01L 27/11807 257/207 |
| 2013/0093012 A1 | * | 4/2013 | Zhang | ................... H01L 29/402 257/335 |
| 2014/0173544 A1 | * | 6/2014 | Giraud | ................ G06F 17/5068 716/119 |

(Continued)

Primary Examiner — Nduka E Ojeh
(74) Attorney, Agent, or Firm — Pramudji Law Group PLLC; Ari Pramudji (57) ABSTRACT

Various implementations described herein are directed to an integrated circuit. The integrated circuit may include a cell having a first region designated for a first type of implant and a second region designated for a second type of implant that is different than the first type of implant. The integrated circuit may include a first implant structure configured to implant the first region with the first type of implant such that the first region extends within a portion of the second region. The integrated circuit may include a second implant structure configured to implant the second region with the second type of implant such that the second region extends within a portion of the first region.

19 Claims, 5 Drawing Sheets

(56) References Cited

U.S. PATENT DOCUMENTS

2017/0104005 A1* 4/2017 Haufe ................. H01L 27/1203

* cited by examiner (prior art)

IMPLANT STRUCTURE FOR AREA REDUCTION

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in physical design, performance and reliability at advanced process nodes may be limited by legal requirements of a standard cell library. For instance, in the case of a standard cell library, which may not have a defined well or substrate ties inside standard cells, designers may be required to tie N-type wells to a highest potential (e.g., a source potential, such as VDD) and further tie the substrate (or P-type wells) to a lowest potential (e.g., ground potential, such as GND or VSS) before performing place-and-route (PnR) using a well tap cell. Further, well tap structures may include an N-type tap formed by an N-type well, an N-type implant, and an active region and a P-type tap formed by a P-type well, a P-type implant, and another active region. Next, the N-type and P-type taps may then be connected or coupled to appropriate voltage potential (e.g., VDD, VSS) using metal wires and contacts/vias. Generally, in reference to the standard cell library, these types of structures should be realized within a minimum possible area.

Figure 1:
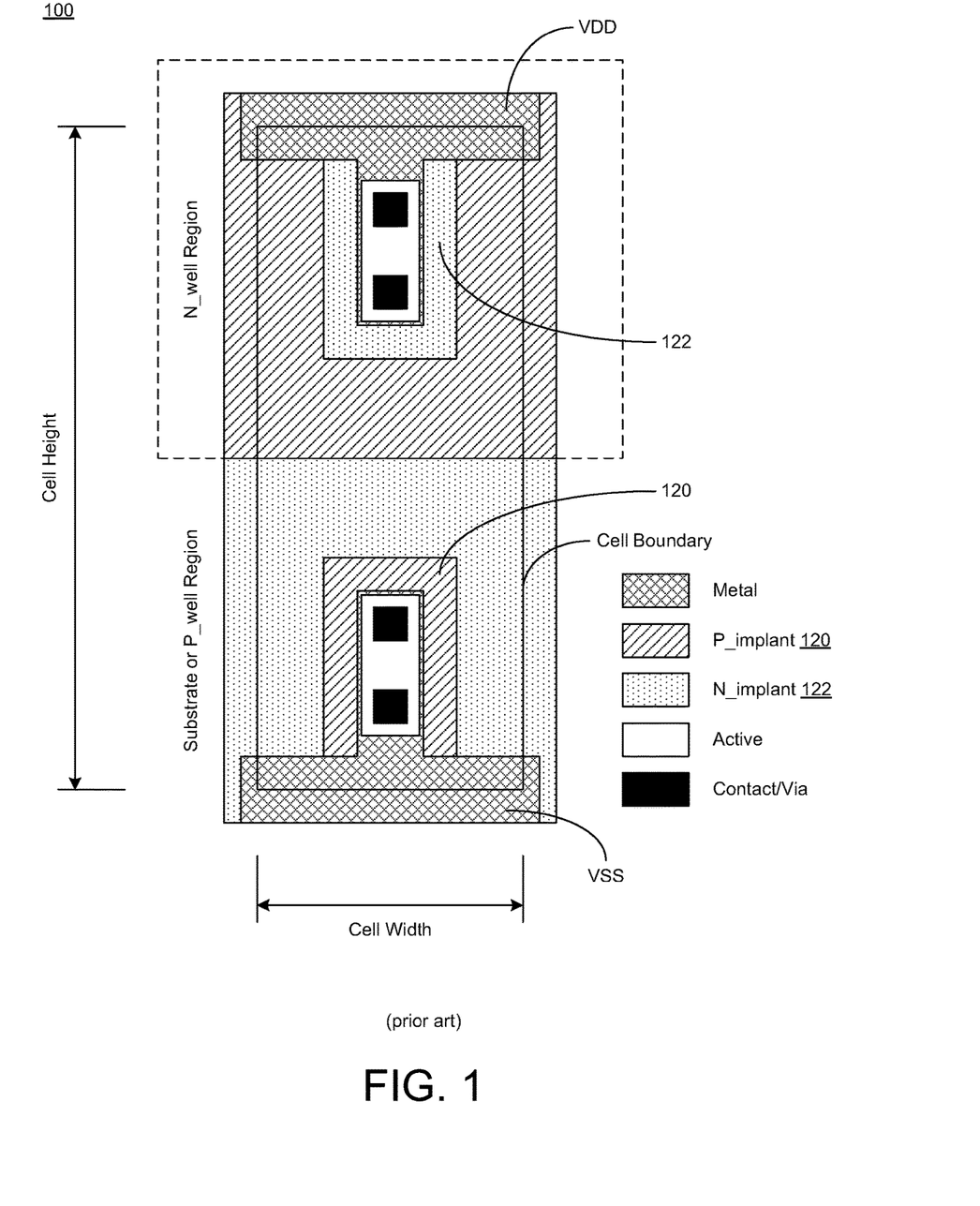
FIG. 1 illustrates a diagram of a conventional implant structure as known in the art.

In reference to physical design, FIG. 1 illustrates a diagram of a conventional implant structure for a cell 100 as known in the art. In particular, FIG. 1 refers to a conventional implant structure for well taps using conventional island style well taps 120, 122. As shown in FIG. 1, an N-type well region may be implanted with a P-type implant and an N-type island 122, and further, a P-type well region may be implanted with an N-type implant and a P-type island 120. As further shown in FIG. 1, the cell 100 may include active regions coupled to different potentials VSS, VDD via metal wires and contacts/vias.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to an implant structure for area reduction in physical design, such as e.g., an improved well tap structure for area reduction. For instance, various implementations described herein refer to a standard cell layout design technique, which may assist with implementing an area efficient well tap structure in high-density standard cell architectures. This technique may reduce area of a well tap cell in high or ultra-high density standard cell libraries. With challenges to meet implant and active area requirements in smaller cell heights, this technique may provide advantages within design rules by creating a legal well tap structure. In standard cells, it may be important for each layer to follow the cell boundary condition defined by the cell architecture. Available area for tap structure after implant spacing from the boundary may not be sufficient to meet design rules, which may demand more cell width. As described herein, this technique uses a continuous implant structure instead of conventional island formation style to overcome minimum implant and active area challenges.

Various implementations of an implant structure for area reduction in physical design will now be described in greater detail herein with reference to FIGS. 2A-4.

Figure 2A:
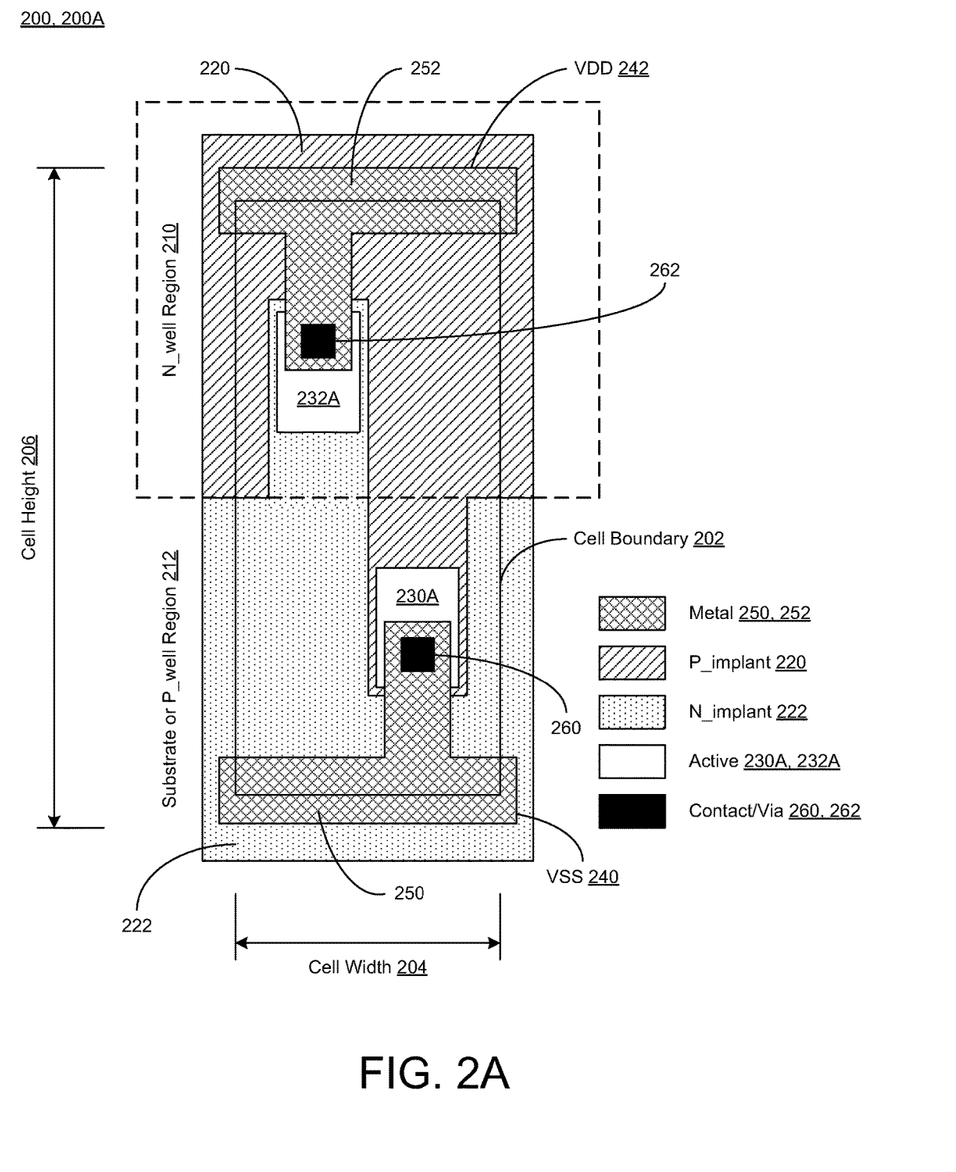
FIGS. 2A-2B illustrate various diagrams of an implant structure for a cell of an integrated circuit in accordance with various implementations described herein.
Figure 2B:
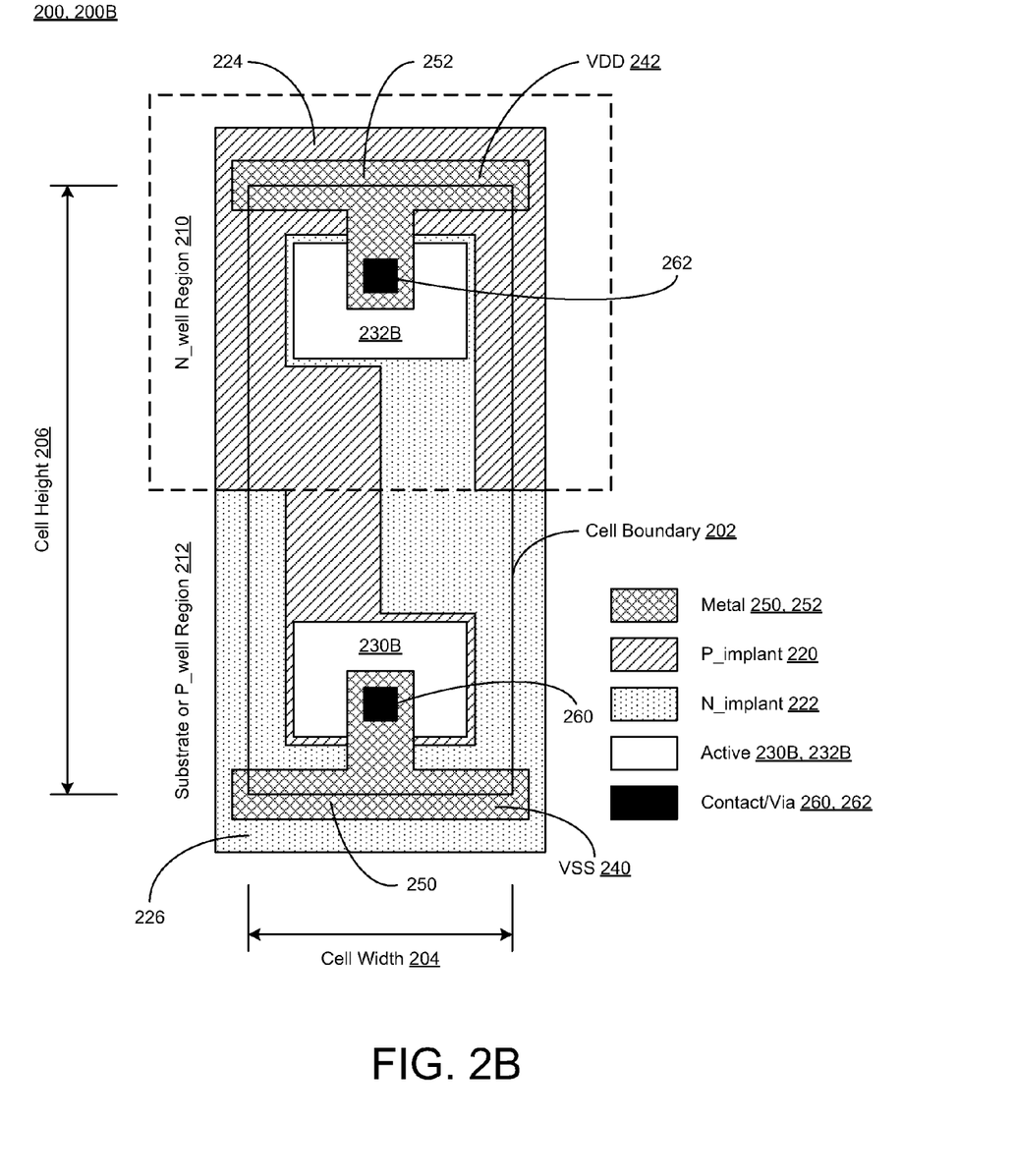

In reference to physical design, FIGS. 2A-2B illustrate various diagrams of an implant structure for a cell 200 of an integrated circuit in accordance with implementations described herein. In particular, FIG. 2A refers to a first cell layout 200A of the cell 200 having first and second implant structures 220, 222 for area reduction of the integrated circuit in physical design, and FIG. 2B refers to a second cell layout 200B of the cell 200 having third and fourth implant structures 224, 226 for area reduction of the integrated circuit in physical design.

In reference to FIG. 2A, the first cell layout 200A of the cell 200 is shown with an instance of the cell 200. The cell 200 may include a first region 210 designated for a first type of implant and a second region 212 designated for a second type of implant that is different than the first type of implant. The cell 200 may include a cell area having a cell boundary 202 defined by the first and second regions 210, 212. The cell boundary 202 may define a cell width 204 and a cell height 206 of the cell 200. The first region 210 may include an N-type well region, and the second region 212 may include a substrate or P-type well region. Further, the first type of implant may include a P-type implant, and the second type of implant may include an N-type implant.

As shown in FIG. 2A, the cell 200 may include the first implant structure 220 configured to implant the second region 212 (e.g., P-well region) with the first type of implant (e.g., P-type implant) such that the first implant structure 220 extends within a portion of the second region 212 (e.g., P-well region). The first implant structure 220 may include a first continuous implant structure configured to implant the first region 210 (e.g., N-well region) with the first type of implant (e.g., P-type implant) that continuously extends within a portion of the second region 212 (e.g., P-well region). The first implant structure 220 may be configured to enclose a first active region 230A of the cell 200 within a boundary of the second region 212 (e.g., P-well region). The first implant structure 220 may be electrically coupled to a first potential 240 having a first polarity via a first metal wire 250 and contact or via 260. For instance, the first potential may be a ground voltage (GND or VSS), and the first polarity may have a negative polarity (−). The first metal wire 250 may be referred to as a metal wiring layer, such as, e.g., an M1 metal layer. The first active region 230A may be referred to as an active diffusion (OD) region. The contact 260 may be referred to as a contact (CO) region.

In reference to this implementation of a P-type tap structure, the given width of the P-type implant extends toward other region (e.g., P-well region) spaced minimum allowed by the Design Rule Check (DRC) from east/west cell boundary over the P-well region. This technique adapts a suitable but legal shape to enclose the legal shape of the active region, and not over the N-type implant. Further, as shown, the tap structure formed may be coupled to appropriate potential (e.g., VSS) using metal wire and contact/via. As such, this technique provides for a continuous implant structure that may be used to overcome the minimum implant area challenge and provide sufficient enclosure to the active region. This may be achieved with the improved well tap layout in minimum area for a given technology.

As shown in FIG. 2A, the cell 200 may include the second implant structure 222 configured to implant the first region 210 (e.g., N-well region) with the second type of implant (e.g., N-type implant) such that the second implant structure 222 extends within a portion of the first region 210 (e.g., N-well region). The second implant structure 222 may include a second continuous implant structure configured to implant the second region 212 (e.g., P-well region) with the second type of implant (e.g., N-type implant) that continuously extends within the portion of the first region 210 (e.g., N-well region). The second implant structure 222 may be configured to enclose a second active region 232A of the cell 200 within a boundary of the first region 210 (e.g., N-well region). The second implant structure 222 may be electrically coupled to a second potential 242 having a second polarity via a second metal wire 252 and contact or via 262. For instance, the second potential may be a source voltage (VDD), and the second polarity may have a positive polarity (+). The second metal wire 252 may be referred to as a metal wiring layer, such as, e.g., an M1 metal layer. The second active region 232A may be referred to as an active diffusion (OD) region. The contact 262 may be referred to as a contact (CO) region.

In reference to this implementation of an N-type tap structure, the given width of N-type implant extends toward other region (e.g., N-well region) spaced minimum allowed by the Design Rule Check (DRC) from east/west cell boundary over the N-well region. This technique adapts a suitable but legal shape to enclose the legal shape of the active region, and not over the P-type implant. Further, as shown, the tap structure formed may be coupled to appropriate potential (e.g., VDD) using metal wire and contact/via. As such, this technique provides for a continuous implant structure that may be used to overcome the minimum implant area challenge and provide sufficient enclosure to the active region. This may be achieved with the improved well tap layout in minimum area for a given technology.

In reference to FIG. 2B, the second cell layout 200B of the cell 200 is shown with another instance of the cell 200. As shown, various features of FIG. 2B are similar to features of FIG. 2A. For instance, the cell 200 may include the first and second regions 210, 212 designated for the first and second types of implants, respectively. Further, the first region 210 may include an N-type well region, and the second region 212 may include a substrate or P-type well region. In addition, the first type of implant may include a P-type implant, and the second type of implant may include an N-type implant.

As shown in FIG. 2B, the cell 200 may further include the third implant structure 224 configured to implant the second region 212 (e.g., P-well region) with the first type of implant (e.g., P-type implant) such that the first implant structure 220 extends within a portion of the second region 212 (e.g., P-well region). The third implant structure 224 may include a first continuous implant structure configured to implant the first region 210 (e.g., N-well region) with the first type of implant (e.g., P-type implant) that continuously extends within a portion of the second region 212 (e.g., P-well region). The third implant structure 224 may be configured to enclose a third active region 230B of the cell 200 within a boundary of the second region 212 (e.g., P-well region). As shown in FIG. 2B, the third active region 230B may be larger or at least cover a larger area than the first active region 230A of FIG. 2A. Further, the third implant structure 224 may be electrically coupled to a first potential 240 having a first polarity via a first metal wire 250 and contact or via 260. For instance, the first potential may be a ground voltage (GND or VSS), and the first polarity may have a negative polarity (−).

As shown in FIG. 2B, the cell 200 may further include the fourth implant structure 226 configured to implant the first region 210 (e.g., N-well region) with the second type of implant (e.g., N-type implant) such that the second implant structure 222 extends within a portion of the first region 210 (e.g., N-well region). The fourth implant structure 226 may include a second continuous implant structure configured to implant the second region 212 (e.g., P-well region) with the second type of implant (e.g., N-type implant) that continuously extends within the portion of the first region 210 (e.g., N-well region). The fourth implant structure 226 may be configured to enclose a fourth active region 232B of the cell 200 within a boundary of the first region 210 (e.g., N-well region). As shown in FIG. 2B, the fourth active region 232B may be larger or at least cover a larger area than the second active region 232A of FIG. 2A. Further, the fourth implant structure 226 may be electrically coupled to a second potential 242 having a second polarity via a second metal wire 252 and contact or via 262. For instance, the second potential may be a source voltage (VDD), and the second polarity may have a positive polarity (+).

Figure 3:
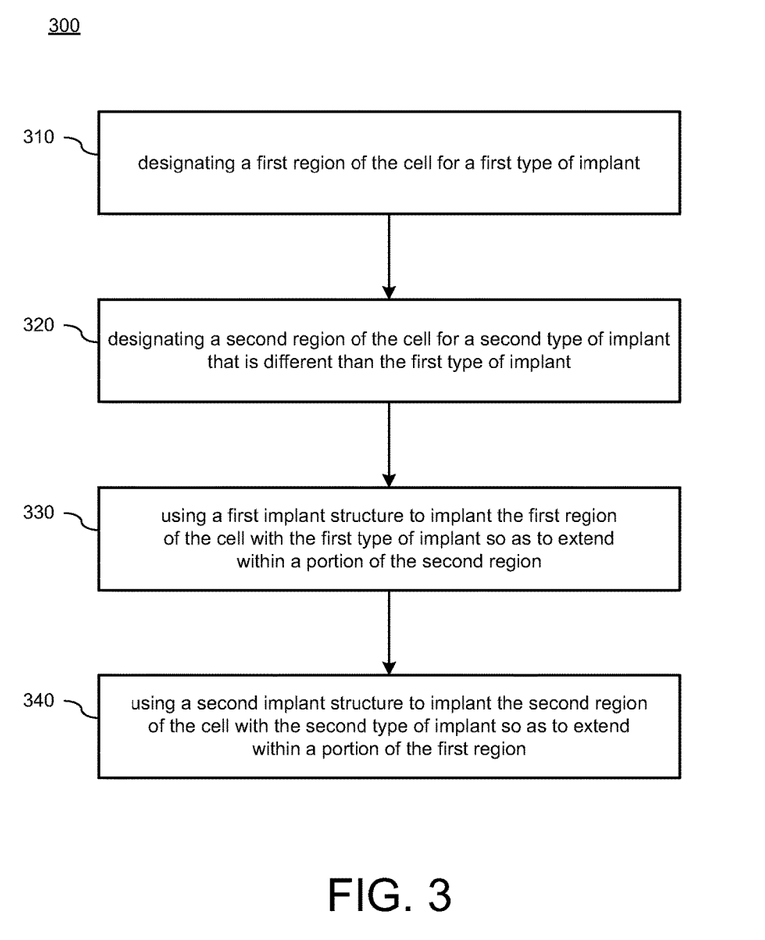
FIG. 3 illustrates a process flow diagram of a method for providing an implant structure for area reduction in physical design in accordance with various implementations described herein.

FIG. 3 illustrates a process flow diagram of a method for providing an implant structure for area reduction in physical design in accordance with various implementations described herein. It should be understood that even though method 300 may indicate a particular order of execution of operations, in some instances, various certain portions of the operations may be executed in a different order, and on different systems. In some other instances, additional operations or steps may be added to and/or omitted from method 300. Further, in some implementations, computing device 404 of FIG. 4 may be configured to perform method 300. In some other implementations, method 300 may be implemented as a program or software instruction process that is configured for area reduction in physical design to improve performance.

At block 310, method 300 may designate a first region of a cell of an integrated circuit for a first type of implant. At block 320, method 300 may designate a second region of the cell for a second type of implant that is different than the first type of implant. In some implementations, the first region may include an N-type well region, and the second region may include a substrate or P-type well region. The first type of implant may include a P-type implant, and the second type of implant may include an N-type implant.

At block 330, method 300 may use a first implant structure to implant the first region of the cell with the first type of implant so as to extend within a portion of the second region. In some implementations, the first implant structure may include a first continuous implant structure configured to implant the first region with the first type of implant that continuously extends within the portion of the second region. The first implant structure may be configured to enclose a first active region of the cell within a boundary of the second region. The first implant structure may be electrically coupled to a first voltage potential having a first voltage polarity via a first metal wire and contact (or via). For instance, the first voltage potential may be a ground voltage (GND or VSS), and the first voltage polarity may have a negative polarity (−).

At block 340, method 300 may use a second implant structure to implant the second region of the cell with the second type of implant so as to extend within a portion of the first region. In some implementations, the second implant structure may include a second continuous implant structure configured to implant the second region with the second type of implant that continuously extends within the portion of the first region. The second implant structure may be configured to enclose a second active region of the cell within a boundary of the first region. The second implant structure may be electrically coupled to a second voltage potential having a second voltage polarity via a second metal wire and contact (or via). For instance, the second voltage potential may be a source voltage (VDD), and the second voltage polarity may have a positive polarity (+).

In some implementations, method 300 may refer to a method of fabricating the cell as part of an integrated circuit. Further, the cell may refer to a cell area having a cell boundary defined by the first and second regions (e.g., N-type and P-type well regions), and the cell boundary may define a cell width and a cell height of the cell.

Figure 4:
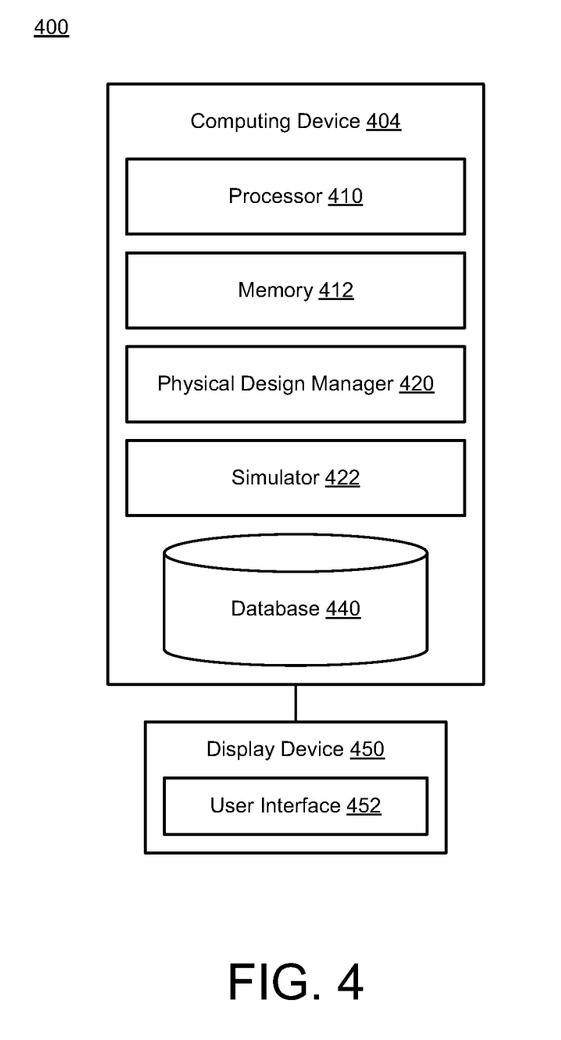
FIG. 4 illustrates a diagram of a system for providing an implant structure for area reduction in physical design in accordance with various implementations described herein.

FIG. 4 illustrates a block diagram of a system 400 for providing an implant structure for area reduction in physical design in accordance with various implementations described herein. Further, the system 400 may be configured for fabricating an integrated circuit with cells having a reduce area layout with improved yield, output net resistance, and electromigration in accordance with various implementations described herein.

In reference to FIG. 4, the system 400 may include a computer based system configured to provide an implant structure for area reduction in physical design. Further, the system 400 may be associated with at least one computing device 404 that may be implemented as a special purpose machine configured to provide an implant structure for area reduction in physical design, as described herein. In some implementations, the computing device 404 may include any standard element(s) and/or component(s), including at least one processor(s) 410, memory 412 (e.g., non-transitory computer-readable storage medium), one or more database (s) 440, power, peripherals, and various other computing elements and/or components that may not be specifically shown in FIG. 4. The computing device 404 may include instructions stored on the non-transitory computer-readable medium 412 that are executable by the at least one processor 410. The computing device 404 may be associated with a display device 450 (e.g., a monitor or other display) that may be used to provide a user interface (UI) 452, such as, e.g., a graphical user interface (GUI). In some instances, the UI 452 may be used to receive various parameters and/or preferences from a user for managing, operating, and/or utilizing the computing device 404. As such, the computing device 404 may include the display device 450 for providing output to a user, and the display device 450 may include the UI 452 for receiving input from the user.

In various implementations, the computing device 404 may be configured to implement various methodologies and/or techniques to provide an implant structure for area reduction in physical design. For instance, the computing device 404 may be configured to analyze operating conditions for cells of an integrated circuit. In reference to FIG. 4, the computing device 404 may include a physical design manager 420 (or layout optimizer) configured to cause the at least one processor 410 to implement one or more techniques described in reference to FIGS. 2A-3, including techniques related to providing an implant structure for area reduction in physical design. The physical design manager 420 may be implemented in hardware and/or software. If implemented in software, the physical design manager 420 may be stored in memory 412 and/or database 440. If implemented in hardware, the physical design manager 420 may be a separate processing component configured to interface with the processor 410.

In some implementations, the physical design manager 420 may be configured to cause the at least one processor 410 to perform various techniques, as described herein in reference to FIGS. 2A-3. For instance, physical design manager 420 may be configured to cause the at least one processor 410 to analyze operating conditions for cells of an integrated circuit. The physical design manager 420 may be configured to cause the at least one processor 410 to assist with fabricating an integrated circuit having one or more cells as described in reference to FIGS. 2A-2B.

In reference to method 300 of FIG. 3, the physical design manager 420 may be configured to cause the at least one processor 410 to assist with fabricating an integrated circuit with area reduction in physical design, including one or more cells of the integrated circuit. The physical design manager 420 may designate a first region of the cell for a first type of implant, such as, e.g., an N-type well region designated for a P-type implant. The physical design manager 420 may designate a second region of the cell for a second type of implant that is different than the first type of implant, such as, e.g., a P-type well region designated for an N-type implant. The physical design manager 420 may use a first implant structure to implant the first region of the cell with the first type of implant so as to extend within a portion of the second region. For instance, the first implant structure may be configured to implant the N-type well region with the P-type implant so as to extend within a portion of the P-type well region. The physical design manager 420 may use a second implant structure to implant the second region of the cell with the second type of implant so as to extend within a portion of the first region. For instance, the second implant structure may be configured to implant the P-type well region with the N-type implant so as to extend within a portion of the N-type well region.

Further, in some implementations, the cell may include a cell area having a cell boundary defined by the N-type region and the P-type region, and the cell boundary may define a cell width and a cell height of the cell. The first implant structure may include a first continuous implant structure configured to implant the N-type well region with the P-type implant that continuously extends within the portion of the P-type well region, and the first continuous implant structure may be configured to enclose a first active region of the cell within a boundary of the P-type well region. The second implant structure may include a second continuous implant structure configured to implant the P-type well region with the N-type implant that continuously extends within the portion of the N-type well region, and the second continuous implant structure may be configured to enclose a second active region of the cell within a boundary of the N-type well region. The first implant structure may be electrically coupled to a ground potential voltage (GND or VSS) having a negative polarity (−) via a first metal wire and contact (or via), and the second implant structure may be electrically coupled to a source potential voltage (VDD) having a positive polarity (+) via a second metal wire and contact (or via).

Moreover, in reference to FIG. 4, the computing device 404 may include a simulator module 422 configured to cause the at least one processor 410 to generate one or more simulations of the integrated circuit. The simulator module 422 may be referred to as a simulating component that may be implemented in hardware and/or software. If implemented in software, the simulator module 422 may be stored in memory 412 or database 440. If implemented in hardware, the simulator module 422 may be a separate processing component configured to interface with the processor 410. In some instances, the simulator module 422 may include a SPICE simulator configured to generate SPICE simulations of the integrated circuit. Generally, SPICE refers to an acronym for Simulation Program with Integrated Circuit Emphasis, which is an open source analog electronic circuit simulator. Further, SPICE is a general-purpose software program used by the semiconductor industry to check the integrity of integrated circuit designs and to predict the behavior of integrated circuit designs. Accordingly, in some instances, the physical design manager 420 may be configured to interface with the simulator module 422 to generate timing data based on one or more simulations (e.g., SPICE simulations) of an integrated circuit that may be used for analyzing the timing data of the integrated circuit to identify instances of timing degradation. Further, the physical design manager 420 may be configured to use the one or more simulations (including, e.g., SPICE simulations) of an integrated circuit for assisting with using an implant structure for area reduction in physical design and with a standard cell layout for improved yield, output net resistance, and electromigration, as described herein.

In some implementations, the computing device 404 may include one or more databases 440 configured to store and/or record various information related to using an implant structure for area reduction in physical design. In some cases, the database(s) 440 may be configured to store and/or record information related to the integrated circuit, operating conditions, and/or timing data. Further, the database(s) 440 may be configured to store and/or record information related to the integrated circuit and timing data in reference to simulation data (including, e.g., SPICE simulation data).

Described herein are various implementations of an integrated circuit. In some implementations, the integrated circuit may include a cell having a first region designated for a first type of implant and a second region designated for a second type of implant that is different than the first type of implant. The integrated circuit may include a first implant structure configured to implant the first region with the first type of implant such that the first region extends within a portion of the second region. The integrated circuit may include a second implant structure configured to implant the second region with the second type of implant such that the second region extends within a portion of the first region.

Described herein are various implementations of a cell of an integrated circuit. In some implementations, the cell may include an N-type well region designated for a P-type implant, and the cell may include a P-type well region designated for an N-type implant. The cell may include a first implant structure configured to implant the N-type well region with the P-type implant that extends within a portion of the P-type well region. The cell may include a second implant structure configured to implant the P-type well region with the N-type implant that extends within a portion of the N-type well region.

Described herein are various implementations of a method of fabricating a cell of an integrated circuit. In some implementations, the method may include designating a first region of the cell for a first type of implant, and the method may include designating a second region of the cell for a second type of implant that is different than the first type of implant. The method may include using a first implant structure to implant the first region of the cell with the first type of implant such that the first region extends within a portion of the second region. The method may include using a second implant structure to implant the second region of the cell with the second type of implant such that the second region extends within a portion of the first region.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    a cell having a first region having a first type of implant and a second region having a second type of implant that is different than the first type of implant;
    a first implant structure that implants the first region with the first type of implant such that the first implant structure extends within a portion of the second region that includes a first active region, wherein the first implant structure is disposed directly in contact with the first active region so as to enclose the first active region; and
    a second implant structure that implants the second region with the second type of implant such that the second implant structure extends within a portion of the first region that includes a second active region, wherein the second implant structure is disposed directly in contact with the second active region so as to enclose the second active region.

2. The integrated circuit of claim 1, wherein the cell comprises a cell area having a cell boundary defined by the first and second regions.

3. The integrated circuit of claim 2, wherein the cell boundary defines a cell width and a cell height of the cell.

4. The integrated circuit of claim 1, wherein the first region comprises an N-type well region, and wherein the second region comprises a substrate or P-type well region.

5. The integrated circuit of claim 1, wherein the first type of implant comprises a P-type implant, and wherein the second type of implant comprises an N-type implant.

6. The integrated circuit of claim 1, wherein the first implant structure comprises a first continuous implant structure that implants the first region with the first type of implant that continuously extends within the portion of the second region.

7. The integrated circuit of claim 1, wherein the first implant structure encloses the first active region of the cell within a boundary of the second region.

8. The integrated circuit of claim 1, wherein the second implant structure comprises a second continuous implant structure that implants the second region with the second type of implant that continuously extends within the portion of the first region.

9. The integrated circuit of claim 1, wherein the second implant structure encloses the second active region of the cell within a boundary of the first region.

10. The integrated circuit of claim 1, wherein the second implant structure is electrically coupled to a second potential having a second polarity via a second metal wire and via.

11. The integrated circuit of claim 10, wherein the second potential comprises a source voltage, and wherein the second polarity comprises a positive polarity.

12. An integrated circuit, comprising:
    a cell having a first region having a first type of implant and a second region having a second type of implant that is different than the first type of implant;
    a first implant structure that implants the first region with the first type of implant such that the first implant structure extends within a portion of the second region that includes a first active region, wherein the first implant structure is disposed directly adjacent to the first active region so as to enclose the first active region; and a second implant structure that implants the second region with the second type of implant such that the second implant structure extends within a portion of the first region that includes a second active region, wherein the second implant structure is disposed directly in contact with the second active region so as to enclose the second active region, wherein the first implant structure is electrically coupled to a first potential having a first polarity via a first metal wire and via, and wherein the first potential comprises a ground voltage, and wherein the first polarity comprises a negative polarity.

13. A cell of an integrated circuit, comprising:
an N-type well region having a P-type implant;
a P-type well region having an N-type implant;
a first implant structure that implants the N-type well region with the P-type implant that extends within a portion of the P-type well region that includes a first active region, wherein the first implant structure is disposed directly adjacent to the first active region so as to enclose the first active region; and
a second implant structure that implants the P-type well region with the N-type implant that extends within a portion of the N-type well region that includes a second active region that is different than the first active region, wherein the second implant structure is disposed directly in contact with the second active region so as to enclose the second active region.

14. The cell of claim 13, wherein the cell comprises a cell area having a cell boundary defined by the N-type well region and the P-type well region, and wherein the cell boundary defines a cell width and a cell height of the cell.

15. The cell of claim 13, wherein the first implant structure comprises a first continuous implant structure that implants the N-type well region with the P-type implant that continuously extends within the portion of the P-type well region, and wherein the first continuous implant structure encloses the first active region of the cell within a boundary of the P-type well region.

16. The cell of claim 13, wherein the second implant structure comprises a second continuous implant structure that implants the P-type well region with the N-type implant that continuously extends within the portion of the N-type well region, and wherein the second continuous implant structure encloses the second active region of the cell within a boundary of the N-type well region.

17. The cell of claim 13, wherein the first implant structure is electrically coupled to a ground potential voltage having a negative polarity via a first metal wire and via, and wherein the second implant structure is electrically coupled to a source potential voltage having a positive polarity via a second metal wire and via.

18. A method of fabricating a cell of an integrated circuit, comprising:
designating a first region of the cell for a first type of implant;
designating a second region of the cell for a second type of implant that is different than the first type of implant;
using a first implant structure to implant the first region of the cell with the first type of implant such that the first implant structure extends within a portion of the second region that includes a first active region, wherein the first implant structure is disposed directly in contact with the first active region so as to enclose the first active region; and
using a second implant structure to implant the second region of the cell with the second type of implant such that the second implant structure extends within a portion of the first region that includes a second active region, wherein the second implant structure is disposed directly in contact with the second active region so as to enclose the second active region.

19. The method of claim 18, wherein the cell comprises a cell area having a cell boundary defined by the first and second regions, and wherein the cell boundary defines a cell width and a cell height of the cell.

* * * * *